United States Patent
Song et al.

(10) Patent No.: US 11,454,560 B2
(45) Date of Patent: Sep. 27, 2022

(54) THREE-DIMENSIONAL WHISKER SENSOR FOR ACCURATE POSITIONING OF END LOCATION

(71) Applicant: Southeast University, Nanjing (CN)

(72) Inventors: Aiguo Song, Nanjing (CN); Mingxin Leng, Nanjing (CN); Baoguo Xu, Nanjing (CN); Huijun Li, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 566 days.

(21) Appl. No.: 16/467,032

(22) PCT Filed: May 23, 2018

(86) PCT No.: PCT/CN2018/088075
§ 371 (c)(1),
(2) Date: Jun. 5, 2019

(87) PCT Pub. No.: WO2019/024575
PCT Pub. Date: Feb. 7, 2019

(65) Prior Publication Data
US 2019/0323816 A1    Oct. 24, 2019

(30) Foreign Application Priority Data
Jul. 31, 2017    (CN) .......................... 201710638753.9

(51) Int. Cl.
*G01L 5/169*    (2020.01)
*G01B 7/00*    (2006.01)
(Continued)

(52) U.S. Cl.
CPC .............. *G01L 5/169* (2020.01); *G01B 7/003* (2013.01); *G01D 11/245* (2013.01);
(Continued)

(58) Field of Classification Search
CPC ...... G01H 11/02; G01D 5/145; G01D 11/245; G01B 7/016; G01B 7/003; G01L 5/169;
(Continued)

(56) References Cited

U.S. PATENT DOCUMENTS

| | | | |
|---|---|---|---|
| 10,024,713 B1 * | 7/2018 | Martin | .................... G01H 11/02 |
| 2011/0031968 A1 * | 2/2011 | Cantave | ............. G01R 33/0035 |
| | | | 324/260 |
| 2013/0233079 A1 * | 9/2013 | Swartz | ...................... G01F 1/56 |
| | | | 73/579 |

FOREIGN PATENT DOCUMENTS

| | | |
|---|---|---|
| CN | 101718535 A | 6/2010 |
| CN | 102193674 A | 9/2011 |

(Continued)

OTHER PUBLICATIONS

Bebek et al., Whisker Sensor Design for Three Dimensional Position Measurement in Robotic Assisted Beating Heart Surgery, 2007 IEEE International Conference on Robotics and Automation, Roma, Italy, Apr. 10-14, 2007, pp. 225-231 (Year: 2007).*
Michelle Froese, What is a standoff?, Fastener Engineering, https://fastenerengineering.com/what-is-a-standoff/, Dec. 23, 2019 (Year: 2019).*
(Continued)

*Primary Examiner* — David M Schindler
(74) *Attorney, Agent, or Firm* — Bayramoglu Law Offices LLC

(57) ABSTRACT

A whisker sensor includes an upper circuit board, a lower circuit board, a flexible whisker, and a magnet. The magnet is fixed to the flexible whisker through a central through hole, and the location of the magnet changes with the swinging of the whisker; the upper and lower circuit boards are identical in shape and size, and are connected through an upright column. A circular hole is formed at the center of the upper circuit board, four Hall sensors are symmetrically distributed on the edge of the circular hole, and the displacement of the whisker in X and Y directions can be obtained by detecting the change in magnetic field generated (Continued)

by the change in location of the magnet; a contact sensor is mounted on the lower circuit board, and is connected to the whisker through a connecting piece, to detect displacement of the whisker in the Z direction.

18 Claims, 5 Drawing Sheets

(51) Int. Cl.
  *G01L 1/22* (2006.01)
  *G01R 33/07* (2006.01)
  *B25J 19/02* (2006.01)
  *G01D 11/24* (2006.01)

(52) U.S. Cl.
  CPC ............ *G01L 1/2287* (2013.01); *G01R 33/07* (2013.01); *B25J 19/02* (2013.01)

(58) Field of Classification Search
  CPC ..... G01L 1/2287; G01R 33/07; G01R 33/072; B25J 13/081; B25J 19/02; G01F 1/56; G01P 5/04
  See application file for complete search history.

(56) References Cited

FOREIGN PATENT DOCUMENTS

| | | | |
|---|---|---|---|
| CN | 104198759 A | 12/2014 | |
| CN | 104199565 A | 12/2014 | |
| CN | 105841856 A | 8/2016 | |
| CN | 106032980 A | 10/2016 | |
| GB | 2587848 A | * 4/2021 | ............ G01D 5/145 |
| JP | 4353624 B2 | 10/2009 | |

OTHER PUBLICATIONS

Partial Translation of Master's Thesis by Zheng, Han-qing, Research on the Application of Object Recognition based on Whisker Sensor Array, 31 pages (Year: 2016).*

Zheng, Hanqing, Research on the Application of the Object Recognition Based on Whisker Sensor Array, Information & Technology, China Master's Theses Full-Text Database, No. 3 , Mar. 15, 2017, ISSN:1674-0246.

Li, Meng, Research on Simulation of the Motion of Beating Heart Based on Whisker Sensor, Information & Technology, China Master's Theses Full-Text Database, No. 4, Apr. 15, 2013, ISSN:1674-0246.

Leng, Mingxin et al. Flexible Whisker Sensor for Accurate Location of Objects, Chinese Journal of Scientific Instrument, vol. 39, No. 1 , Jan. 31, 2018, ISSN:0254-3087, pp. 118-126.

* cited by examiner

THREE-DIMENSIONAL WHISKER SENSOR FOR ACCURATE POSITIONING OF END LOCATION

CROSS REFERENCE TO THE RELATED APPLICATIONS

This application is the national phase entry of International Application No. PCT/CN2018/088075, filed on May 23, 2018, which is based upon and claims priority to Chinese Patent Application No. 201710638753.9, filed on Jul. 31, 2017, the entire contents of which are incorporated herein by reference.

TECHNICAL FIELD

The present invention belongs to the technical field of sensors, and relates to a flexible whisker sensor technology, which can quickly and accurately sense three-dimensional displacement and realize accurate positioning of a end location, thereby realizing three-dimensional positioning of a touched object.

BACKGROUND

With the continuous development of robotics, various sensors including visual sensors, force sensors, and tactile sensors are essential to robots, which provide robots with perceptive information that interacts with ambient features, and the ability of robots to perceive information is the basis of intelligence. At present, visual sensors have been widely used. However, the visual sensors have the disadvantages of complex structure and high environmental requirements. In some circumstances with low visibility, harsh environment and narrow space, tactile sensors are more effective. A whisker sensor is one of tactile sensors, and has the advantages of high sensitivity, small influence on the measured object, high accuracy, etc. It is a bionic research on animal whiskers. In the early 1990s, foreign scholars have researched the whisker sensor, and related research in China is still at an initial stage.

At present, most of the existing whisker sensors in China are used for obstacle detection, and can only output whether an object is touched or not by the whisker sensor; or by mounting a motor or another driving device at the end of the whisker, the object is scanned to obtain the appearance information of the object, such as shape and size, which is time-consuming and inaccurate and cannot locate the object. Some whisker sensors depend on precise machining process or mechanical structure design, which is complicated to process and is not easy to mount.

To realize the accurate positioning of the object by the robot, the present invention provides a combined whisker sensor, which is simple in structure and easy to assemble. The change in magnetic field is detected by means of a voltage difference between two Hall sensors in the X-axis or Y-axis direction, so as to obtain the displacement of the whisker in the X and Y directions, and the change in pressure in the Z direction is detected by means of a voltage value output by a contact sensor, so as to obtain the change in displacement in the Z direction. After calibration and compensation, the location of the end of the whisker can be quickly and accurately positioned according to the voltage output of each sensor.

SUMMARY

Technical Problem

In order to improve the positioning accuracy and sensitivity of the whisker sensor, the present invention provides a three-dimensional whisker sensor for accurate positioning of a end location. When a whisker is in contact with an object, the location information of the touched object relative to the sensor is quickly and accurately determined according to the three-dimensional displacement of the end of the whisker, so as to realize accurate positioning.

Technical Solution

To realize the foregoing technical objective, the present invention provides a three-dimensional whisker sensor for accurate positioning of a end location, wherein the whisker sensor is mounted at a robot body or a end of a mechanical arm for determining the spatial location of an object in contact with the whisker sensor relative to the body. The whisker sensor comprises an upper circuit board, a lower circuit board, a flexible whisker, a magnet, a Hall sensor, a contact sensor, an upright column, and a fastener.

The upper and lower circuit boards are PCB circuit boards and are identical in shape and size, the surfaces of the circuit boards are provided with a lead and a patch element required by a detection circuit, and four positioning holes are symmetrically distributed at the same locations of the edges of the circuit boards in cross fashion, respectively; wherein a large circular hole is formed at the center of the upper circuit board, and defines the range within which a whisker can move freely, the center of the circle coincides with the center of the circuit board, and four Hall sensors are symmetrically distributed on the edge of the circular hole in cross fashion; one contact sensor is fixed at the center of the lower circuit board; the upper and lower circuit boards are connected by means of the upright column through the positioning holes, and the upright column is fixed to the circuit boards by means of the fastener.

The flexible whisker is connected to the contact sensor by means of a connecting piece, and is connected to the magnet by means of a through hole; an upper surface of the magnet is flush with an upper surface of the Hall element; a signal of the Hall sensor or the contact sensor is connected to an external circuit by means of soldering holes; and the centers of circles of the upper and lower circuit boards, the center of the contact sensor, and the center of the magnet are all located on a straight line where the whisker is located.

Preferably, the Hall sensor can convert the change in magnetic field into a linear change output of the voltage, and is soldered to the circuit board by means of a soldering hole.

Preferably, the contact sensor is a high-sensitivity pressure sensor that can convert a small change in pressure into a linear change output of the voltage and is soldered to the circuit board by means of a bonding pad.

Preferably, the flexible whisker is made of a carbon fiber material or a flexible wire material.

Advantageous Effect

The creative combination of a Hall sensor and a contact sensor expands the original function of the sensors to realize the measurement of the three-dimensional displacement of the end of the whisker, so that the location of the measured object can be determined.

The use of the Hall sensor and the contact sensor converts the change in end location into a change in distribution of magnetic field of the magnet and the change in pressure. Through the processing of an amplifying circuit and a differential circuit, it is possible to detect a small displacement change, thereby improving the sensitivity of measurement.

The detection circuit is simple and compact in structure, easy to process, disassemble and assemble, and easy to maintain and fix.

The distance between the upper and lower circuit boards and the range of movement of the whisker can be adjusted as needed, to obtain different sensor performances, wide application range, and flexible parameters.

The processing cost is low, the components are easy to obtain, and it is beneficial to wide promotion and use.

The linearity and repeatability are good, and the measurement accuracy is high.

DETAILED DESCRIPTION OF THE EMBODIMENTS

The present invention is further described below with reference to the accompanying drawings.

Figure 1:
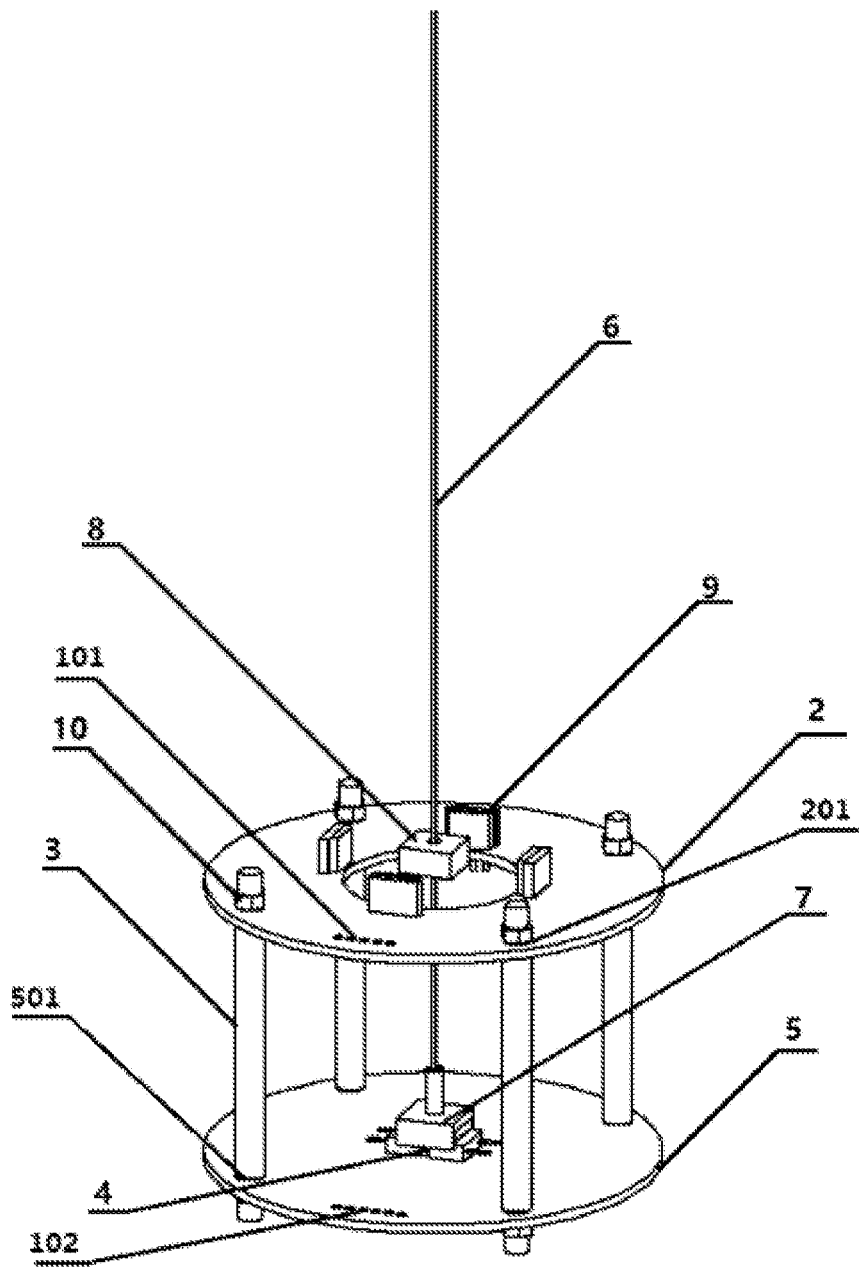
FIG. 1 is a schematic diagram showing an overall structure of a sensor according to the present invention.

As shown in FIG. 1, the present invention provides a three-dimensional whisker sensor for accurate positioning of a end location, wherein the whisker sensor is mounted at a robot body or a end of a mechanical arm for determining the spatial location of an object in contact with the whisker sensor relative to the body, and the whisker sensor comprises an upper circuit board 2, a lower circuit board 5, a flexible whisker 6, a magnet 8, a Hall sensor 9, a contact sensor 4, an upright column 3, and a fastener 10.

Figure 2:
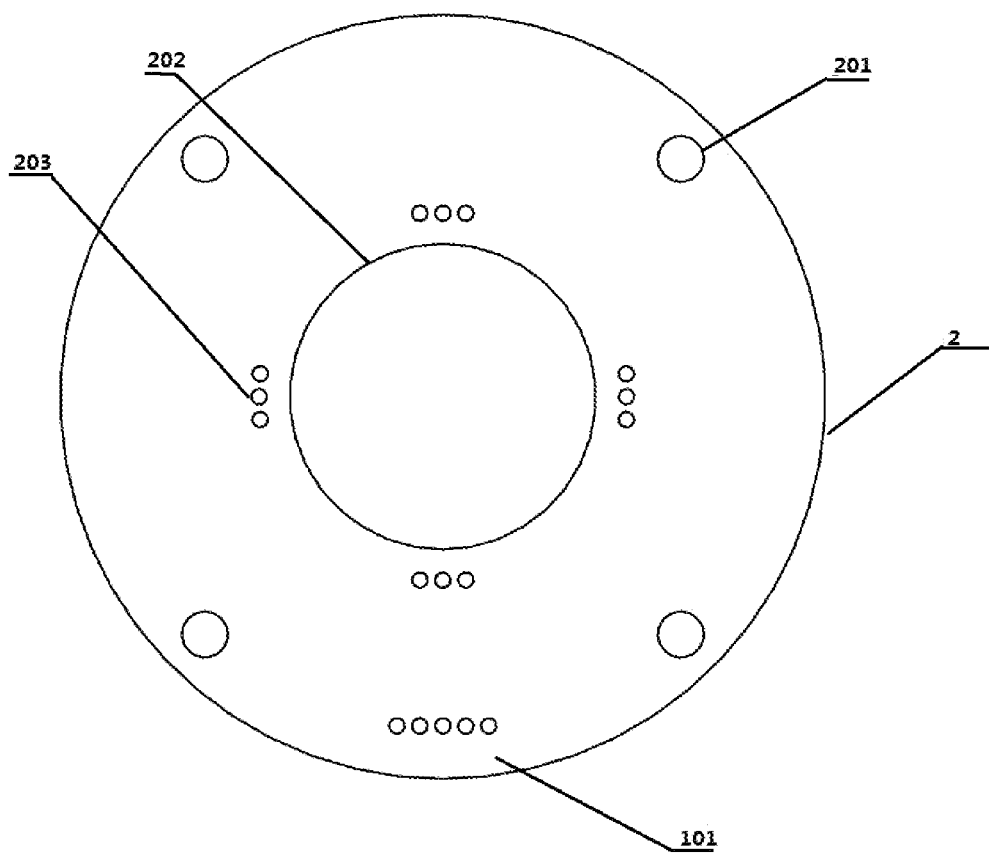
FIG. 2 is a schematic top view of an upper circuit board of a sensor according to the present invention.

As shown in FIG. 2, the upper circuit board is a PCB circuit board and has a circular shape with the diameter of 50 mm. The surface of the upper circuit board includes a lead and a patch element required by a detection circuit, and four positioning holes are symmetrically distributed at the edge of the upper circuit board in cross fashion. The diameter of the positioning hole is 3 mm, and the distance between each positioning hole and the center of a circle of the circuit board is 20 mm. A circular hole with the diameter of 20 mm is formed at the center of the upper circuit board 2, and the center of a circle of the circular hole coincides with the center of a circle of the circuit board. The circular hole ensures that the range of movement of the magnet during the movement of the whisker does not exceed the range of the circular hole. Four Hall sensors 9 are symmetrically distributed at the edge of the round hole in cross fashion to respectively measure the change in magnetic field in the X direction and the Y direction, and are connected to soldering holes on the circuit board by means of soldering.

Figure 3:
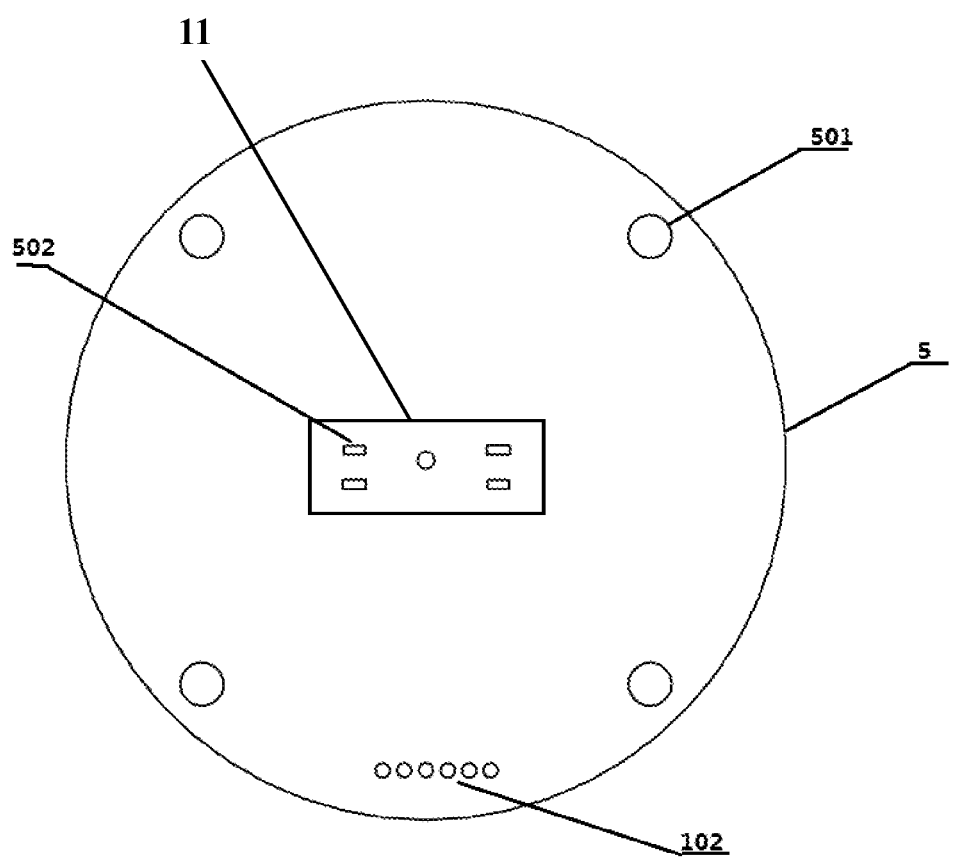
FIG. 3 is a schematic diagram of a lower circuit board according to the present invention.

As shown in FIG. 3, the lower circuit board 5 is a PCB circuit board and has a circular shape with the diameter of 50 mm, and the center thereof is provided with one contact sensor 4. The surface of the lower circuit board includes a lead and a patch element required by a detection circuit, and four positioning holes are symmetrically distributed at the edge of the lower circuit board in cross fashion. The diameter of the positioning hole is 3 mm, and the distance between each positioning hole and the center of a circle of the circuit board is 20 mm. Four pins from the contact sensor 4 are connected to a bonding pad 11 of the lower circuit board 5 by means of soldering. The stress point of the contact sensor 4 coincides with the center of a circle of the lower circuit board 5 for measuring the change in pressure in the Z direction.

As shown in FIG. 1, the flexible whisker 6 is made of a carbon fiber material, has the diameter of 1 mm and the length of 160 mm, and is used for transferring the displacement in the X and Y directions to the magnet 8 and transferring the displacement in the Z direction to the contact sensor 4.

Figure 4:
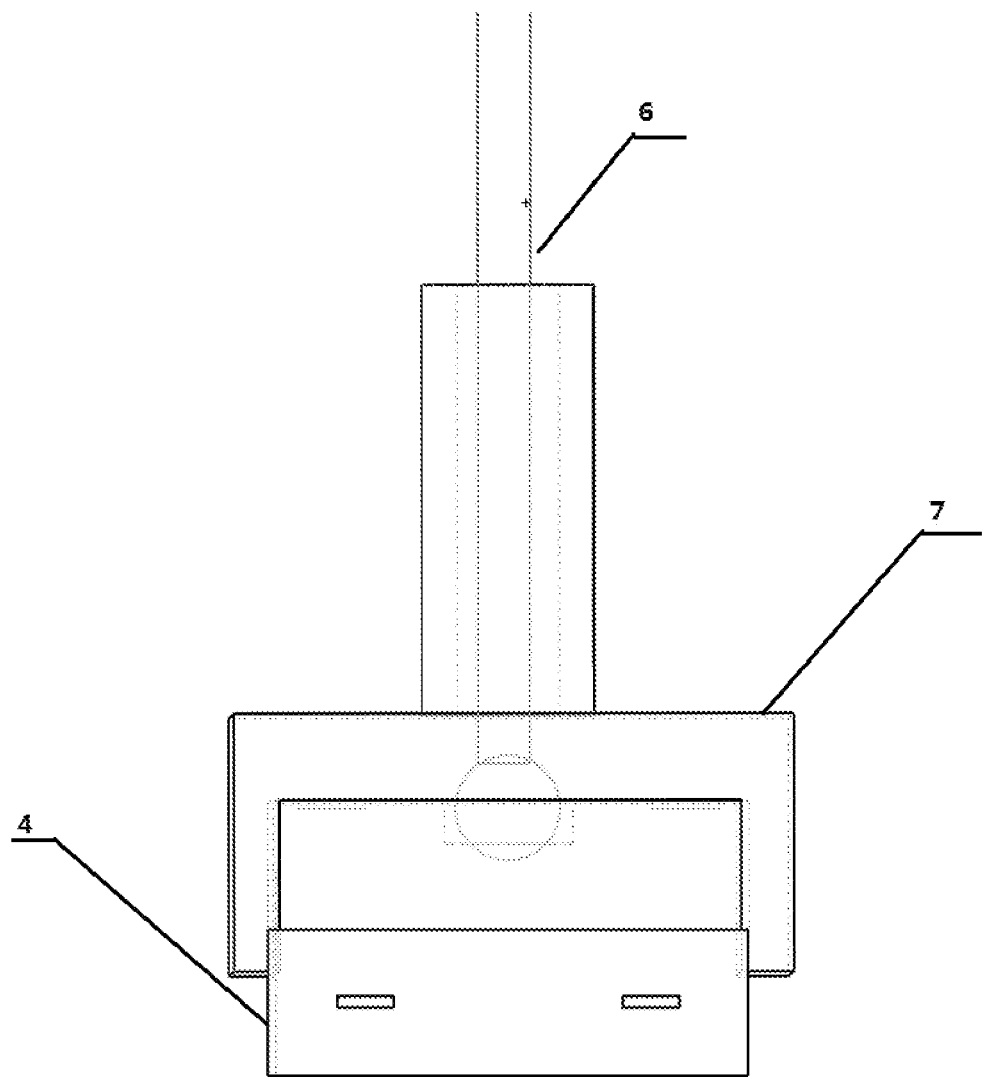
FIG. 4 is a schematic diagram showing connections of a contact sensor, a connecting piece and a whisker according to the present invention.

As shown in FIG. 4, a connecting piece 7 can be designed to a "convex" shape, and the bottom thereof is fixedly connected to the contact sensor 4 by means of an adhesive. The flexible whisker 6 is in contact with the contact sensor by means of a circular hole having the diameter of 1.2 mm at the upper portion of the connecting piece 7, so that the whisker is in accurate contact with the stress point of the contact sensor, and the whisker may be fixed to the connecting piece by means of an adhesive, if necessary.

As shown in FIG. 1, the Hall sensor 9 can convert the change in magnetic field into a linear change output of the voltage. The difference between the output voltages of two Hall sensors in the X and Y directions is 0 when the whisker is in a static state. The distribution of magnetic field in the corresponding direction changes when the displacement in the X and Y directions occurs, and one of the output voltages of the two Hall sensors is increased, and the other output voltage is decreased. The difference between the output voltages is proportional to the magnitude of displacement, and the positive or negative difference depends on the direction of displacement. The relationship between the magnitude of displacement and the output difference of the two Hall sensors can be found by means of calibration and fitting.

As shown in FIG. 1, the contact sensor 4 can convert the change in pressure into a linear change output of the voltage. An input value of the contact sensor is an initial value when the whisker is in the static state. The pressure applied by the whisker on the contact sensor changes when the displacement in the Z direction occurs. The relationship between the magnitude of displacement and the output of the contact sensor can be found by means of calibration and fitting.

As shown in FIG. 1, the magnet 8 is a cuboid of 5 mm*5 mm*3 mm, and a circular hole having the diameter of 1.2 mm is formed at the center of the magnet 8 and extends through the upper and lower surfaces. The flexible whisker 6 passes through the circular hole and is fixedly connected to the magnet 8 by means of an adhesive. An upper surface of the magnet 8 and an upper surface of the Hall sensor 9 are on the same plane.

Figure 5:
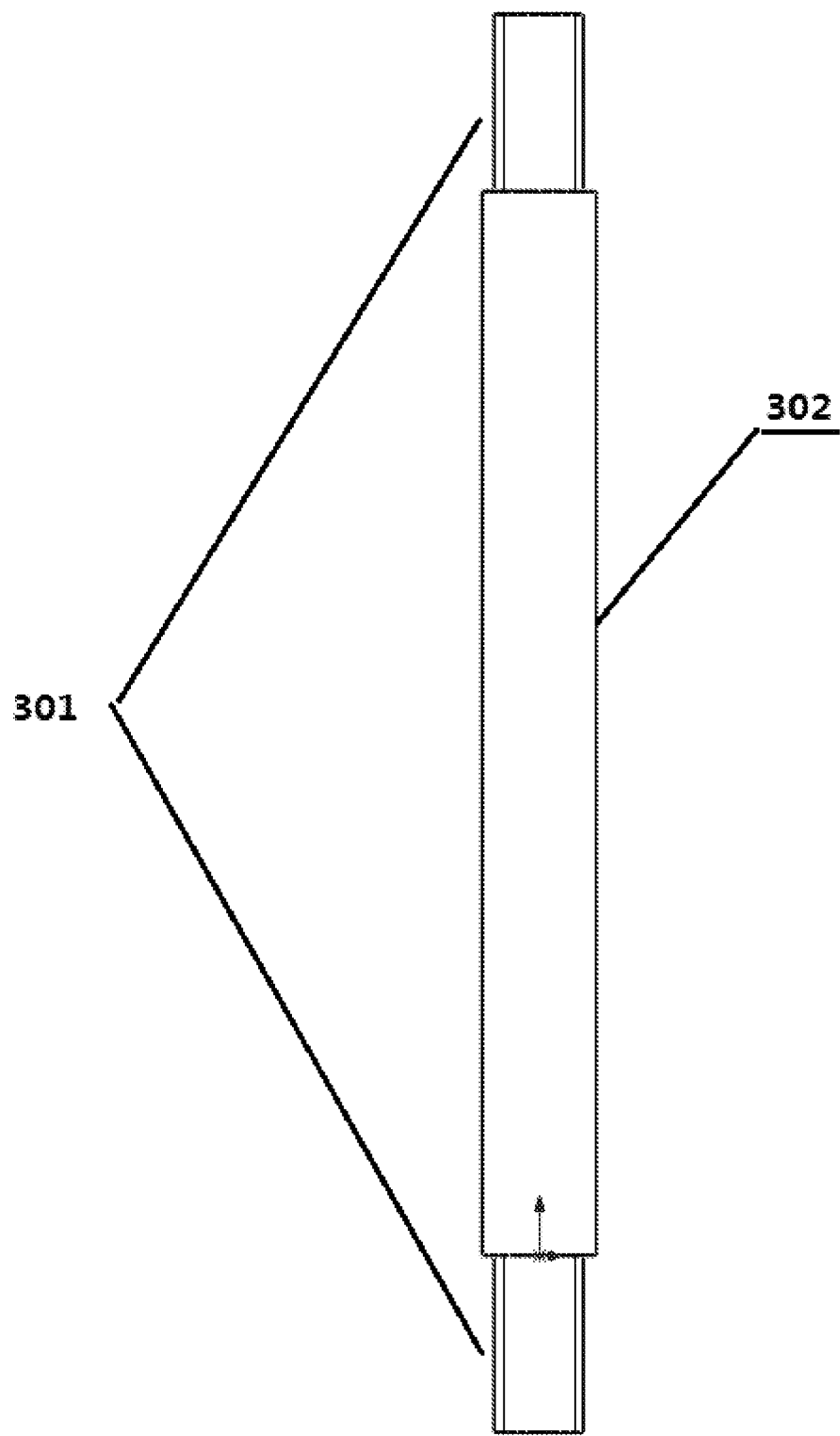
FIG. 5 is a schematic diagram of an upright column of the present invention.

As shown in FIG. 5, the upright column 3 is formed by connecting three circular columns, where the middle circular column (302) has the diameter of 5 mm and the length of 35 mm, and the circular columns at two ends have the length of 7 mm and are provided with external threads having the diameter of 3 mm. The fastener 10 is provided with an internal thread having the diameter of 3 mm.

As shown in FIG. 1, the circular columns 301 at both ends of the upright column, and not the middle portion 302 of the upright column, pass through the positioning holes 201 and 501 in the upper circuit board and the lower circuit board, respectively, and the fastener 10 is threadedly connected to the circular columns 301, thereby ensuring secure and stable connection between the circuit boards and the upright column.

What is claimed is:

1. A three-dimensional whisker sensor for accurate positioning of an end location, the whisker sensor is configured to be mounted on a robot body or an end of a mechanical arm for determining a spatial location of an object in contact with the whisker sensor relative to the body, the whisker sensor comprising:
an upper circuit board,
a lower circuit board,
a flexible whisker,
a magnet,
four Hall sensors,
a contact sensor,
an upright column, and
a fastener,
wherein the upper circuit board and the lower circuit board are printed circuit boards and are identical in shape and size, and four positioning holes of the upper circuit board and four positioning holes of the lower circuit board are located at respective and corresponding locations spaced from outer edges of each respective printed circuit board in a cross fashion;
wherein a circular hole is formed at a center of the upper circuit board and defines a range within which the flexible whisker can move freely, a center of the circular hole coincides with the center of the circuit board, and the four Hall sensors are symmetrically distributed on an edge of the circular hole in cross fashion;
four pins from the contact sensor are connected to a bonding pad of the lower circuit board by solder;
the upper circuit board and the lower circuit board are connected by the upright column through a positioning hole of the four positioning holes of the upper circuit board and a positioning hole of the four positioning holes of the lower circuit board, and the upright column is fixed to the upper circuit board and the lower circuit board by the fastener;
the flexible whisker is connected to the contact sensor by a connecting piece, and is connected to the magnet by a through hole;
an upper surface of the magnet is flush with an upper surface of the four Hall sensors;
a signal of the four Hall sensors or the contact sensor is configured to be connected to an external circuit by soldering holes; and
the center of the upper circuit board, a center of the lower circuit board, a center of the contact sensor, and a center of the magnet are all located on a straight line where the flexible whisker is located.

2. The three-dimensional whisker sensor according to claim 1, wherein the upper circuit board comprises a lead and a patch element required by a detection circuit.

3. The three-dimensional whisker sensor according to claim 1, wherein the lower circuit board comprises a lead and a patch element required by a detection circuit and the contact sensor is provided at the center of the lower circuit board.

4. The three-dimensional whisker sensor according to claim 1, wherein sizes of the positioning holes are related to a diameter of ends of the upright column, so as to ensure that the ends of the upright column pass through the positioning holes.

5. The three-dimensional whisker sensor according to claim 1, wherein the four Hall sensors convert a change in a magnetic field into a linear change output of a voltage, and are connected to soldering holes on the upper circuit board and are perpendicular to a surface of the upper circuit board.

6. The three-dimensional whisker sensor according to claim 1, wherein the contact sensor converts a change in a pressure into a linear change output of a voltage.

7. The three-dimensional whisker sensor according to claim 1, wherein the flexible whisker is made of a carbon fiber material or a flexible wire material, has a diameter of 0.8-1.2 mm and a length of 100-200 mm, and is configured to transfer a displacement to the magnet and the contact sensor.

8. The three-dimensional whisker sensor according to claim 1, wherein the through hole is a central through hole formed at the center of the magnet, the central through hole extends through an upper surface and a lower surface of the magnet, the diameter of the central through hole is greater than the diameter of the flexible whisker, and the flexible whisker passes through the magnet and is fixed to the magnet by an adhesive.

9. The three-dimensional whisker sensor according to claim 1, wherein when a three-dimensional coordinate system is established with the center of the magnet as the origin, the magnet is axisymmetric with respect to an X-axis and a Y-axis, respectively, a connecting line of two opposite Hall sensors of the four Hall sensors is parallel to the X-axis, a connecting line of two opposite Hall sensors of the four Hall sensors is parallel to the Y-axis, and the upper surface of the magnet and an upper surface of each Hall sensor are on a same plane.

10. The three-dimensional whisker sensor according to claim 1, wherein an end of the flexible whisker is in contact with a stress point of the contact sensor.

11. The three-dimensional whisker sensor according to claim 1, wherein the upright column is formed by connecting three circular columns, wherein a middle circular column is longer in length than circular columns of the three circular columns at two ends of the upright column and has a diameter greater than a diameter of the positioning holes; and the circular columns at the two ends of the upright column have an external thread, and have a diameter less than the diameter of the positioning holes.

12. The three-dimensional whisker sensor according to claim 2, wherein the four Hall sensors convert a change in a magnetic field into a linear change output of a voltage, and are connected to soldering holes on the upper circuit board and are perpendicular to a surface of the upper circuit board.

13. The three-dimensional whisker sensor according to claim 3, wherein the contact sensor converts a change in a pressure into a linear change output of a voltage.

14. The three-dimensional whisker sensor according to claim 8, wherein when a three-dimensional coordinate system is established with the center of the magnet as the origin, the magnet is axisymmetric with respect to an X-axis and a Y-axis, respectively, a connecting line of two opposite Hall sensors of the four Hall sensors is parallel to the X-axis, a connecting line of two opposite Hall sensors of the four Hall sensors is parallel to the Y-axis, and the upper surface of the magnet and an upper surface of each Hall sensor are on a same plane.

15. The three-dimensional whisker sensor according to claim 6, wherein an end of the flexible whisker is in contact with a stress point of the contact sensor.

16. The three-dimensional whisker sensor according to claim 1, wherein a bottom of the connecting piece is fixedly connected to the contact sensor by an adhesive.

17. The three-dimensional whisker sensor according to claim 1, wherein the connecting piece has a hole at an upper portion of the connecting piece and the flexible whisker is in contact with the contact sensor by the hole of the connecting piece and the flexible whisker is fixed to the connecting piece by an adhesive.

18. The three-dimensional whisker sensor according to claim 1, wherein the contact sensor is a pressure sensor.

* * * * *